US012738749B2

(12) United States Patent
Hamada

(10) Patent No.: US 12,738,749 B2
(45) Date of Patent: Sep. 15, 2026

(54) STORAGE BATTERY MANAGEMENT DEVICE AND METHOD FOR MANAGING BATTERY DEVICE

(71) Applicant: MUSASHI SEIMITSU INDUSTRY CO., LTD., Toyohashi (JP)

(72) Inventor: Kenji Hamada, Toyohashi (JP)

(73) Assignee: Musashi Seimitsu Industry Co., Ltd., Aichi (JP)

(*) Notice: Subject to any disclaimer, the term of this patent is extended or adjusted under 35 U.S.C. 154(b) by 721 days.

(21) Appl. No.: 18/270,926

(22) PCT Filed: Jan. 27, 2021

(86) PCT No.: PCT/JP2021/002717

§ 371 (c)(1),
(2) Date: Oct. 5, 2023

(87) PCT Pub. No.: WO2022/162755

PCT Pub. Date: Aug. 4, 2022

(65) Prior Publication Data

US 2024/0195185 A1 Jun. 13, 2024

(51) Int. Cl.
*H02J 7/40* (2026.01)
*G01R 31/367* (2019.01)
(Continued)

(52) U.S. Cl.
CPC .......... *H02J 7/445* (2026.01); *G01R 31/3835* (2019.01); *H02J 7/82* (2026.01);
(Continued)

(58) Field of Classification Search
CPC ..... H02J 7/445; H02J 7/82; H02J 7/92; G01R 31/3835
(Continued)

(56) References Cited

U.S. PATENT DOCUMENTS 5,613,227 A 3/1997 Maki et al.
5,876,870 A 3/1999 Kawabata
(Continued)

FOREIGN PATENT DOCUMENTS

JP 106-224844 A 8/1994
JP H10-229646 A 8/1998
(Continued)

OTHER PUBLICATIONS

Examination report dated Aug. 27, 2025 issued in the corresponding Indonesian Patent Application 202317046629.
(Continued)

*Primary Examiner* — Allyson N Trail
(74) *Attorney, Agent, or Firm* — Carrier, Shende & Associates P.C.; Joseph P. Carrier; Fulchand P. Shende

(57) ABSTRACT

A storage battery management device that manages a battery assembly in which a plurality of storage batteries are connected in series includes: a control unit; an activation switch; and a power supply activation circuit that turns on the activation switch when a logic state of the external activation signal becomes an activation logic and maintains the on-state of the activation switch as long as an activation maintenance signal is input. The control unit includes a line switch control unit, an activation maintenance control unit, and an OCV identifying unit. The line switch control unit turns on a line switch when the external activation signal becomes an activation logic. The activation maintenance control unit starts the output of the activation maintenance signals to the power supply activation circuit when the external activation signal becomes the activation logic. The OCV identifying unit acquires the change amount of the voltage of each storage battery at predetermined time intervals when the external activation signal becomes the stop logic, records the voltage of each storage battery as the OCV
(Continued)

when the change amount of the voltage all becomes equal to or smaller than a predetermined change amount, and stops the output of the activation maintenance signal.

7 Claims, 9 Drawing Sheets

(51) Int. Cl.
*G01R 31/3835* (2019.01)
*H02J 7/50* (2026.01)
*H02J 7/82* (2026.01)
*H02J 7/92* (2026.01)
*H02J 7/96* (2026.01)

(52) U.S. Cl.
CPC .................. *H02J 7/92* (2026.01); *H02J 7/96* (2026.01); *G01R 31/367* (2019.01); *H02J 7/50* (2026.01)

(58) Field of Classification Search
USPC .......................................................... 320/136
See application file for complete search history.

(56) References Cited

U.S. PATENT DOCUMENTS 12,392,834 B2 * 8/2025 Wang ................. G01R 31/3648
2005/0206364 A1 * 9/2005 Ishikawa .............. G01R 31/396
324/103 P
2007/0108941 A1 5/2007 Sainomoto et al.
2016/0219664 A1 * 7/2016 Ellenberger .............. H02J 7/35
2016/0308375 A1 * 10/2016 Pognant-Gros ......... B60L 53/12
2020/0025827 A1 1/2020 Kawasaki et al.
2024/0421622 A1 * 12/2024 Choi .................. H01M 10/052
2026/0074305 A1 * 3/2026 Kim .................... H01M 10/425

FOREIGN PATENT DOCUMENTS

JP 2007-143285 A 6/2007
JP 2015-146707 A 8/2015
JP 2020-016454 A 1/2020

OTHER PUBLICATIONS

Examination report dated Aug. 27, 2025 issued in the corresponding Indian Patent Application 202317046629.

* cited by examiner

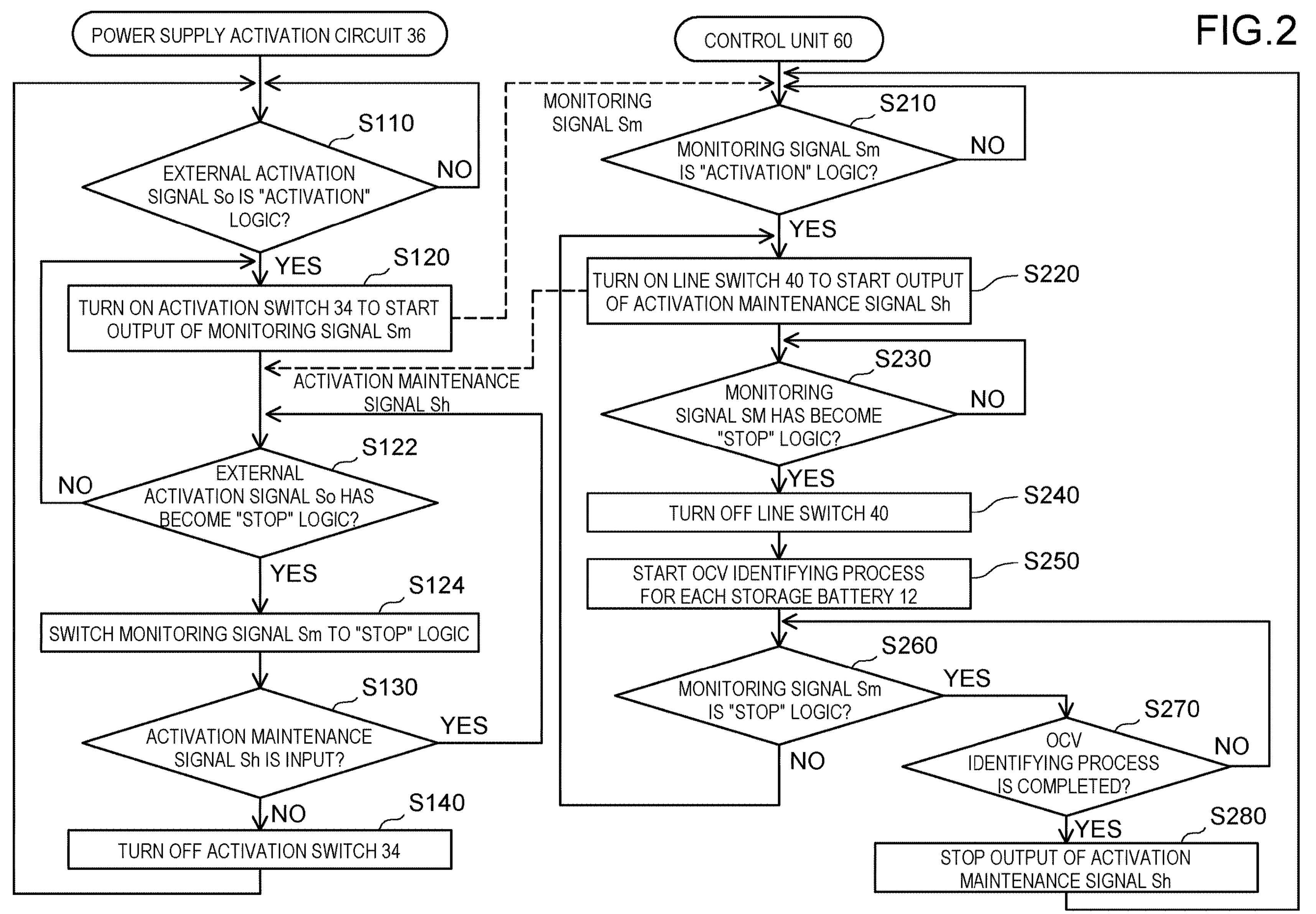
FIG.2
POWER SUPPLY ACTIVATION CIRCUIT 36
S110
EXTERNAL ACTIVATION SIGNAL So IS "ACTIVATION" LOGIC?
NO
YES
S120
TURN ON ACTIVATION SWITCH 34 TO START OUTPUT OF MONITORING SIGNAL Sm
ACTIVATION MAINTENANCE SIGNAL Sh
S122
EXTERNAL ACTIVATION SIGNAL So HAS BECOME "STOP" LOGIC?
NO
YES
S124
SWITCH MONITORING SIGNAL Sm TO "STOP" LOGIC
S130
ACTIVATION MAINTENANCE SIGNAL Sh IS INPUT?
YES
NO
S140
TURN OFF ACTIVATION SWITCH 34
CONTROL UNIT 60
MONITORING SIGNAL Sm
S210
MONITORING SIGNAL Sm IS "ACTIVATION" LOGIC?
NO
YES
S220
TURN ON LINE SWITCH 40 TO START OUTPUT OF ACTIVATION MAINTENANCE SIGNAL Sh
S230
MONITORING SIGNAL SM HAS BECOME "STOP" LOGIC?
NO
YES
S240
TURN OFF LINE SWITCH 40
S250
START OCV IDENTIFYING PROCESS FOR EACH STORAGE BATTERY 12
S260
MONITORING SIGNAL Sm IS "STOP" LOGIC?
YES
NO
S270
OCV IDENTIFYING PROCESS IS COMPLETED?
NO
YES
S280
STOP OUTPUT OF ACTIVATION MAINTENANCE SIGNAL Sh

FIG.3

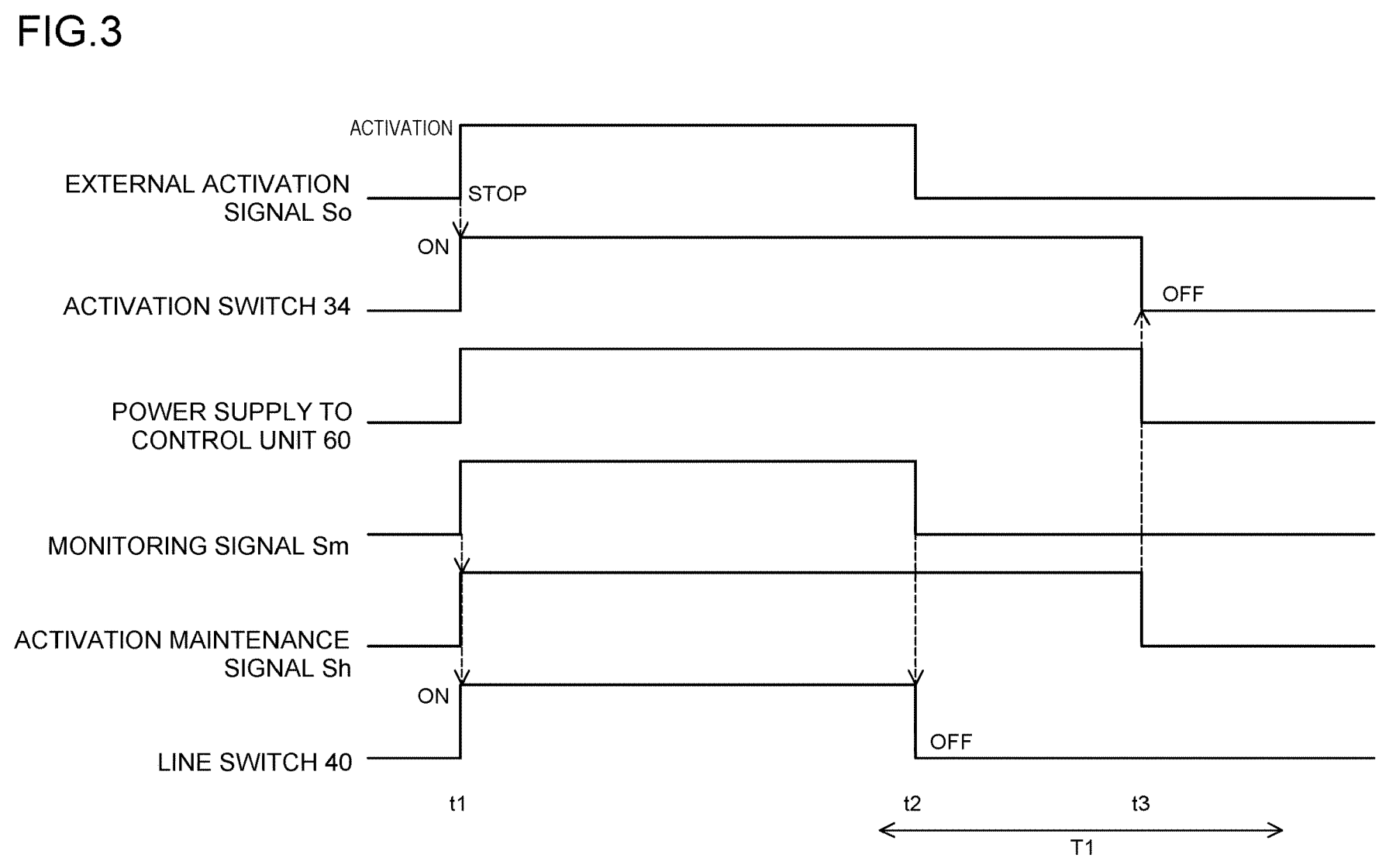

EXTERNAL ACTIVATION SIGNAL So
ACTIVATION
STOP
ACTIVATION SWITCH 34
ON
OFF
POWER SUPPLY TO CONTROL UNIT 60
MONITORING SIGNAL Sm
ACTIVATION MAINTENANCE SIGNAL Sh
ON
OFF
LINE SWITCH 40
t1
t2
t3
T1

EXTERNAL ACTIVATION SIGNAL So
ACTIVATION
STOP
LINE SWITCH 40
ON
OFF
Vcell
MEASURED OCV
ΔVcell
ΔVth
RESET
TIMER
ACTIVATION MAINTENANCE SIGNAL Sh
ACTIVATION SWITCH 34
ON
OFF
t2
t3

EXTERNAL ACTIVATION SIGNAL So
ACTIVATION
STOP
LINE SWITCH 40
ON
OFF
ESTIMATED OCV
MEASURED OCV
Vcell
ΔVth
ΔVcell
RESET
TIMER
ACTIVATION MAINTENANCE SIGNAL Sh
ACTIVATION SWITCH 34
ON
OFF
t2
ta
tb
tc
t3

EXTERNAL ACTIVATION SIGNAL So
ACTIVATION
STOP
LINE SWITCH 40
ON
OFF
ESTIMATED OCV
Vcell
ΔVcell
RESET
TIMER
ACTIVATION MAINTENANCE SIGNAL Sh
ACTIVATION SWITCH 34
ON
t4
ta
td

STORAGE BATTERY MANAGEMENT DEVICE AND METHOD FOR MANAGING BATTERY DEVICE

TECHNICAL FIELD

The technology disclosed herein relates to a storage battery management device and a method for managing a battery device.

BACKGROUND ART

In a battery assembly in which plurality of storage batteries are connected in series, the OCV (open circuit voltage) of each storage battery is measured, e.g., to estimate the SOC (state of charge) of each storage battery.

Battery voltage varies depending on the operating state of the target device powered by the battery. Therefore, a known technique for obtaining accurate battery voltage measurement values is to measure the battery voltage when the target device is in a specific operating mode (see, e.g., Patent Document 1). Furthermore, since the battery voltage may fluctuate even when the target device is in a specific operation mode, a known technique is to repeatedly measure the battery voltage in a predetermined cycle and calculate the average of those measurements as the battery voltage (see, e.g., Patent Document 2).

CITATION LIST

Patent Literature

Patent Document 1: JP H06-224844 A
Patent Document 2: JP H10-229646 A

SUMMARY OF INVENTION

Technical Problem

When the OCV of each storage battery constituting a battery assembly is measured by using the conventional techniques described above, the control unit performing the OCV measurement is in the OCV measurement state (or in standby for measurement) for a long period of time, resulting in a large power consumption for the OCV measurement.

This document discloses a technology that can solve the above-mentioned problem.

Solution to Problem

The technology disclosed herein may have the following aspects, for example.

(1) A first storage battery device disclosed herein is a device that manages a battery assembly in which a plurality of storage batteries are connected in series, and includes a voltage measuring unit, a control unit, a voltage conversion circuit, an activation switch unit, and a power supply activation circuit. The voltage measuring unit measures the voltage of each of the plurality of storage batteries. The voltage conversion circuit is provided on a path that supplies power from the battery assembly to the control unit. The activation switch is connected between the voltage conversion circuit and the battery assembly. The power supply activation circuit includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit. The control unit includes a line switch control unit, an activation maintenance control unit, and an OCV identifying unit. The line switch control unit turns on a line switch connected in series with the battery assembly when the logic state of the external activation signal becomes an activation logic, and turns off the line switch when the logic state of the external activation signal becomes a stop logic. The activation maintenance control unit starts the output of the activation maintenance signal to the power supply activation circuit when the logic state of the external activation signal becomes the activation logic. The OCV identifying unit acquires the change amount of the voltage of each of the plurality of storage batteries measured by the voltage measuring unit at predetermined time intervals when the logic state of the external activation signal becomes the stop logic, and when the change amount of the voltage of each of the plurality of storage batteries all becomes equal to or smaller than a predetermined change amount, records the voltage of each of the plurality of storage batteries at that time point as the OCV and causes the activation maintenance control unit to stop the output of the activation maintenance signal.

According to this storage battery management device, after the logic state of the external activation signal becomes the stop logic and the line switch is turned off, when the change amount of voltage of each storage battery become smaller than the predetermined change amount, i.e., when the voltage of each storage battery converges sufficiently, the voltage at that time point is recorded as the OCV, and thus the OCV of each storage battery can be accurately identified. As a result, the predetermined process (e.g., estimation of SOC) using the OCV can be accurately executed. In addition, according to this storage battery device, the power consumption required to identify the OCV of each storage battery can be reduced because the output of the activation maintenance signal is stopped immediately after the OCV is recorded, the activation switch is turned off, and the power supply from the battery assembly to the control unit is stopped.

(2) In the above storage battery management device, the OCV identifying unit may acquire the change amount of the voltage of each of the plurality of storage batteries measured by the voltage measuring unit at predetermined time intervals when the logic state of the external activation signal becomes the stop logic, and every time the number of acquisitions of the change amount of the voltage reaches a predetermined number, estimate the OCV of each of the plurality of storage batteries based on the change amount of the voltage acquired until then and record the estimated OCV before the change amounts of the voltage of each of the plurality of storage batteries all becomes equal to or smaller than a predetermined change amount. This storage battery management device can identify the OCV of each storage battery at a relatively early time. As a result, it is possible to perform a predetermined process (e.g., estimation of SOC) that uses the OCV at a relatively early time. According to this storage battery management device, even if the logic state of the external activation signal becomes the activation logic before the change amounts of the voltage of each storage battery all becomes equal to or smaller than the predetermined change amount and the line switch is turned on so that the OCV of each storage battery cannot be measured, the OCV of each storage battery can be identified by using the results of the OCV estimation executed before that time. As a result, it is possible to avoid that the predetermined process (e.g., estimation of SOC) that uses the OCV becomes infeasible.

(3) A second storage battery device disclosed herein is a device that manages a battery assembly in which a plurality of storage batteries are connected in series, and includes a voltage measuring unit, a control unit, a voltage conversion circuit, an activation switch unit, and a power supply activation circuit. The voltage measuring unit measures the voltage of each of the plurality of storage batteries. The voltage conversion circuit is provided on a path that supplies power from the battery assembly to the control unit. The activation switch is connected between the voltage conversion circuit and the battery assembly. The power supply activation circuit includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit. The control unit includes a line switch control unit, an activation maintenance control unit, and an OCV identifying unit. The line switch control unit turns on a line switch connected in series with the battery assembly when the logic state of the external activation signal becomes an activation logic, and turns off the line switch when the logic state of the external activation signal becomes a stop logic. The activation maintenance control unit starts the output of the activation maintenance signal to the power supply activation circuit when the logic state of the external activation signal becomes the activation logic. The OCV identifying unit acquires the change amount of the voltage of each of the plurality of storage batteries measured by the voltage measuring unit at predetermined time intervals when the logic state of the external activation signal becomes the stop logic, and when the number of acquisitions of the change amount reaches a predetermined number, estimates the OCV of each of the plurality of storage batteries based on the change amount acquired until then, records the estimated OCV, and causes the activation maintenance control unit to stop the output of the activation maintenance signal.

According to this storage battery management device, the power consumption required to identify the OCV of each storage battery can be reduced because the output of the activation maintenance signal is stopped immediately after the OCV is recorded, the activation switch is turned off, and the power supply from the battery assembly to the control unit is stopped. In particular, according to this storage battery management process, the identification of the OCV of each storage battery can be completed and the power supply from the battery assembly to the control unit can be stopped at a predetermined timing regardless of the degree of convergence of the voltage of each storage battery. Therefore, even if the convergence of the voltage of each storage battery takes time, as in the case of a large current flowing through the battery assembly immediately before, the identification of the OCV of each storage battery can be completed and the power supply from the battery assembly to the control unit can be stopped before the convergence. Therefore, this storage battery management system can effectively reduce the power consumption required to identify the OCV of each storage battery.

(4) A third storage battery management device disclosed herein is a device that manages a battery assembly in which a plurality of storage batteries are connected in series, and includes a voltage measuring unit, a control unit, a voltage conversion circuit, an activation switch unit, and a power supply activation circuit. The voltage measuring unit measures the voltage of each of the plurality of storage batteries. The voltage conversion circuit is provided on a path that supplies power from the battery assembly to the control unit. The activation switch is connected between the voltage conversion circuit and the battery assembly. The power supply activation circuit includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit. The control unit includes a line switch control unit, an activation maintenance control unit, and an OCV identifying unit. The line switch control unit turns on a line switch connected in series with the battery assembly when the logic state of the external activation signal becomes an activation logic, and turns off the line switch when the logic state of the external activation signal becomes a stop logic. The activation maintenance control unit starts the output of the activation maintenance signal to the power supply activation circuit when the logic state of the external activation signal becomes the activation logic. The OCV identifying unit acquires the change amount of the voltage of each of the plurality of storage batteries measured by the voltage measuring unit at predetermined time intervals when the logic state of the external activation signal becomes the stop logic, and every time the number of acquisitions of the change amount of the voltage reaches a predetermined number, estimates the OCV of each of the plurality of storage batteries based on the change amount of the voltage acquired until then, records the estimated OCV, and causes the activation maintenance control unit to stop the output of the activation maintenance signal when a predetermined time has elapsed since the line switch was turned off.

According to this storage battery management device, the power consumption required to identify the OCV of each storage battery can be reduced because the output of the activation maintenance signal is stopped immediately after the OCV is recorded, the activation switch is turned off, and the power supply from the battery assembly to the control unit is stopped. In particular, according to this storage battery management process, the identification of the OCV of each storage battery can be completed and the power supply from the battery assembly to the control unit can be stopped at a predetermined timing regardless of the degree of convergence of the voltage of each storage battery. Therefore, even if the convergence of the voltage of each storage battery takes time, as in the case of a large current flowing through the battery assembly immediately before, the identification of the OCV of each storage battery can be completed and the power supply from the battery assembly to the control unit can be stopped before the convergence. Therefore, this storage battery management system can effectively reduce the power consumption required to identify the OCV of each storage battery.

(5) In the above storage battery management device, the OCV identifying unit may acquire the change amount of the voltage of each of the plurality of storage batteries measured by the voltage measuring unit at predetermined time intervals when the logic state of the external activation signal becomes the stop logic, and cause the activation maintenance control unit to stop the output of the activation maintenance signal when the change amount of the voltage of each of the plurality of storage batteries all becomes equal to or smaller than a predetermined change amount, and then when the logic state of the external activation signal becomes an activation logic, record the voltage of each of the plurality of storage batteries at that time point as the OCV and cause the line switch control unit to turn on the line switch. This storage battery management device records the voltage of each storage battery that has converged further enough as the OCV, so that it is possible to more accurately identify the OCV. As a result, it is possible to more accurately perform predetermined processes (e.g., estimation of SOC) that use the OCV.

The technology disclosed herein can be implemented in various forms, such as a storage battery management device, a battery device provided with a storage battery management device and a battery assembly, methods for managing those devices, computer programs for implementing those methods, a non-temporary recording medium recording the computer programs, among others.

DESCRIPTION OF EMBODIMENTS

A. First Embodiment

A-1. Configuration of Battery Device 100

Figure 1:
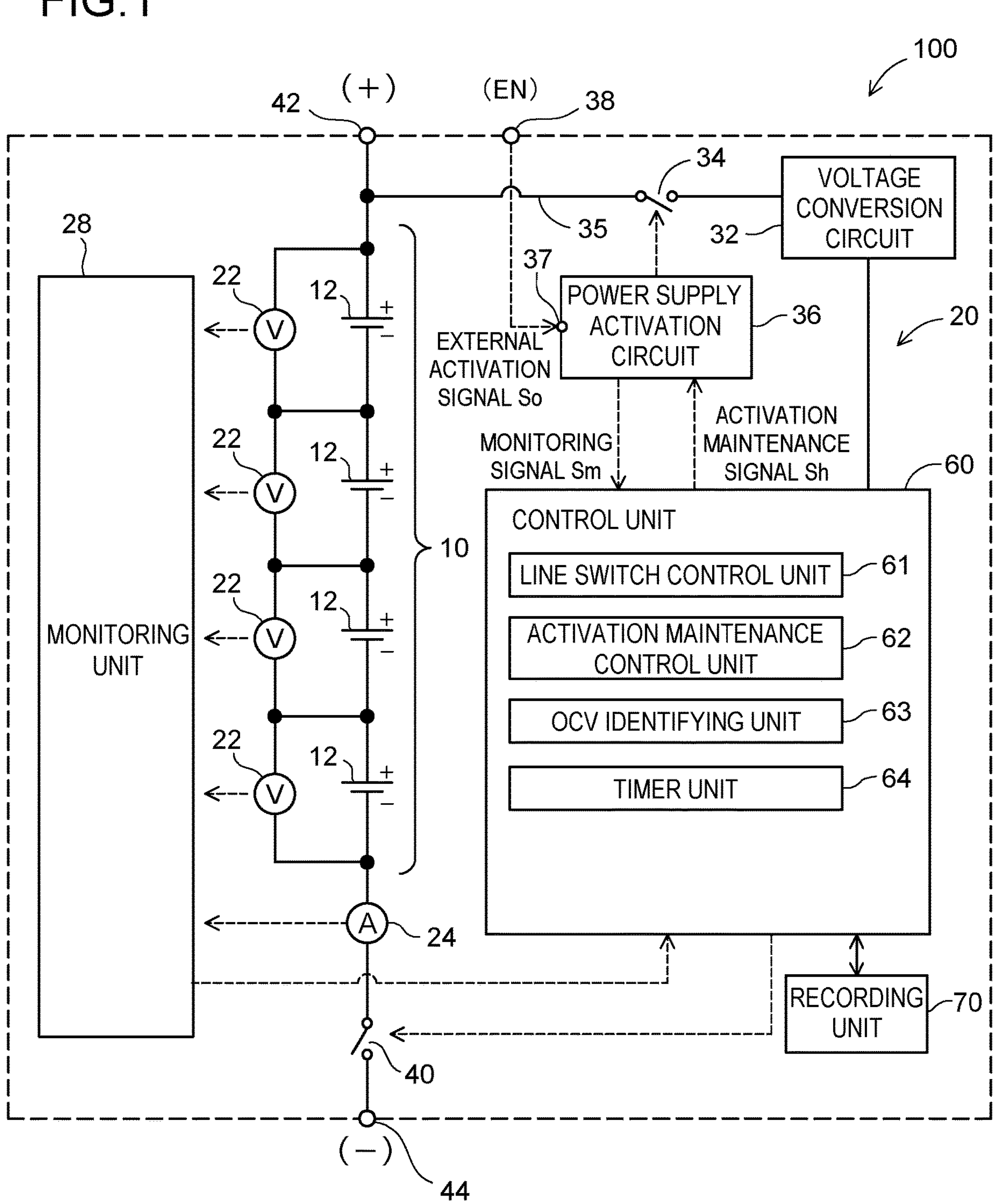
FIG. 1 an explanatory view illustrating a configuration of a battery device 100 in a first embodiment FIG. 2 a sequence diagram illustrating a storage battery management process of the first embodiment FIG. 3 an explanatory view illustrating an example of a state of each signal and a state of each switch during the storage battery management process of the first embodiment FIG. 4 an explanatory view illustrating an example of a state of each signal, a state of each switch, and a state of the voltage Vcell of each storage battery 12 during a particular time period in the storage battery management process of the first embodiment FIG. 5 an explanatory view illustrating an example of a state of each signal, a state of each switch, and a state of the voltage Vcell of each storage battery 12 during a particular time period in the storage battery management process of a second embodiment FIG. 6 an explanatory view illustrating an example of a state of each signal, a state of each switch, and a state of the voltage Vcell of each storage battery 12 during a particular time period in the storage battery management process of a third embodiment FIG. 7 an explanatory view illustrating another example of a state of each signal, a state of each switch, and a state of the voltage Vcell of each storage battery 12 during a particular time period in the storage battery management process of the third embodiment FIG. 8 an explanatory view illustrating an example of a state of each signal, a state of each switch, and a state of the voltage Vcell of each storage battery 12 during a particular time period in the battery management process of a fourth embodiment FIG. 9 an explanatory view illustrating an example of a state of each signal, a state of each switch, and a state of the voltage Vcell of each storage battery 12 during a particular time period in the battery management process of a fifth embodiment

FIG. 1 is an explanatory view schematically illustrating a configuration of a battery device 100 in a first embodiment. The battery device 100 includes a battery assembly 10 and a storage battery management device 20.

The battery assembly 10 has a configuration in which a plurality of storage batteries 12 are connected in series. In this embodiment, the battery assembly 10 consists of four storage batteries 12. Each storage battery 12 is, e.g., a lithium-ion battery. The battery assembly 10 is connected to a load and an external power source, not shown, via a positive terminal 42 and a negative terminal 44.

The storage battery management device 20 is a device for managing the battery device 100 including the battery assembly 10. The storage battery management device 20 includes a voltmeter 22, an ammeter 24, a monitoring unit 28, a voltage conversion circuit 32, an activation switch 34, a power supply activation circuit 36, a line switch 40, a control unit 60, and a recording unit 70.

One voltmeter 22 is provided for each storage battery 12. Each voltmeter 22 is connected in parallel to each storage battery 12, measures the voltage of each storage battery 12, and outputs a signal indicating the measured voltage to the monitoring unit 28. The ammeter 24 is connected in series to the battery assembly 10. The ammeter 24 measures the current flowing through the battery assembly 10 and outputs a signal indicating the measured current to the monitoring unit 28. The monitoring unit 28 outputs signals indicating the voltage of each storage battery 12 and the current flowing through the battery assembly 10 to the control unit 60 based on the signals received from the voltmeter 22 and the ammeter 24. The voltmeter 22 and monitoring unit 28 are examples of the voltage measuring unit.

The line switch 40 is provided between battery assembly 10 and negative terminal 44. The line switch 40 is controlled on and off by the control unit 60 to open and close the connection between the battery assembly 10 and a load/external power source. For example, a MOSFET or relay may be used as the line switch 40.

The control unit 60 is configured by using, e.g., a CPU, a multi-core CPU, and a programmable device (such as field programmable gate array (FPGA) and programmable logic device (PLD)) to control the operation of the storage battery management device 20. The control unit 60 has functions as a line switch control unit 61, an activation maintenance control unit 62, an OCV identifying unit 63, and a timer unit 64. The functions of these units are described in conjunction with the description of the storage battery management process described below.

The recording unit 70 is composed of, e.g., ROM, RAM, a hard disk drive (HDD), and is used to store various programs and data, or as a work area or data storage area when executing various processes. For example, the recording unit 70 stores a computer program for executing the storage battery management process described below. The computer program is provided, e.g., in the form of a computer-readable recording medium (not shown) such as a CD-ROM, DVD-ROM, and USB memory, and is stored in the recording unit 70 by being installed in the battery device 100.

The voltage conversion circuit 32 is provided on the path 35 that supplies power from the battery assembly 10 to the control unit 60. The voltage conversion circuit 32 is a circuit that converts the voltage of the power from the battery assembly 10 to supply the voltage-converted power to the control unit 60. The activation switch 34 is located between the battery assembly 10 and the voltage conversion circuit 32 in the above path 35 and opens and closes the connection between the battery assembly 10 and the voltage conversion circuit 32. For example, a MOSFET or relay may be used as the activation switch 34. The power supply activation circuit 36 is a circuit that controls the on/off of the activation switch 34. The power supply activation circuit 36 includes an input terminal 37 to which an external activation signal So is input via a signal reception terminal 38 (enable, EN).

A-2. Storage Battery Management Process

Figure 4:
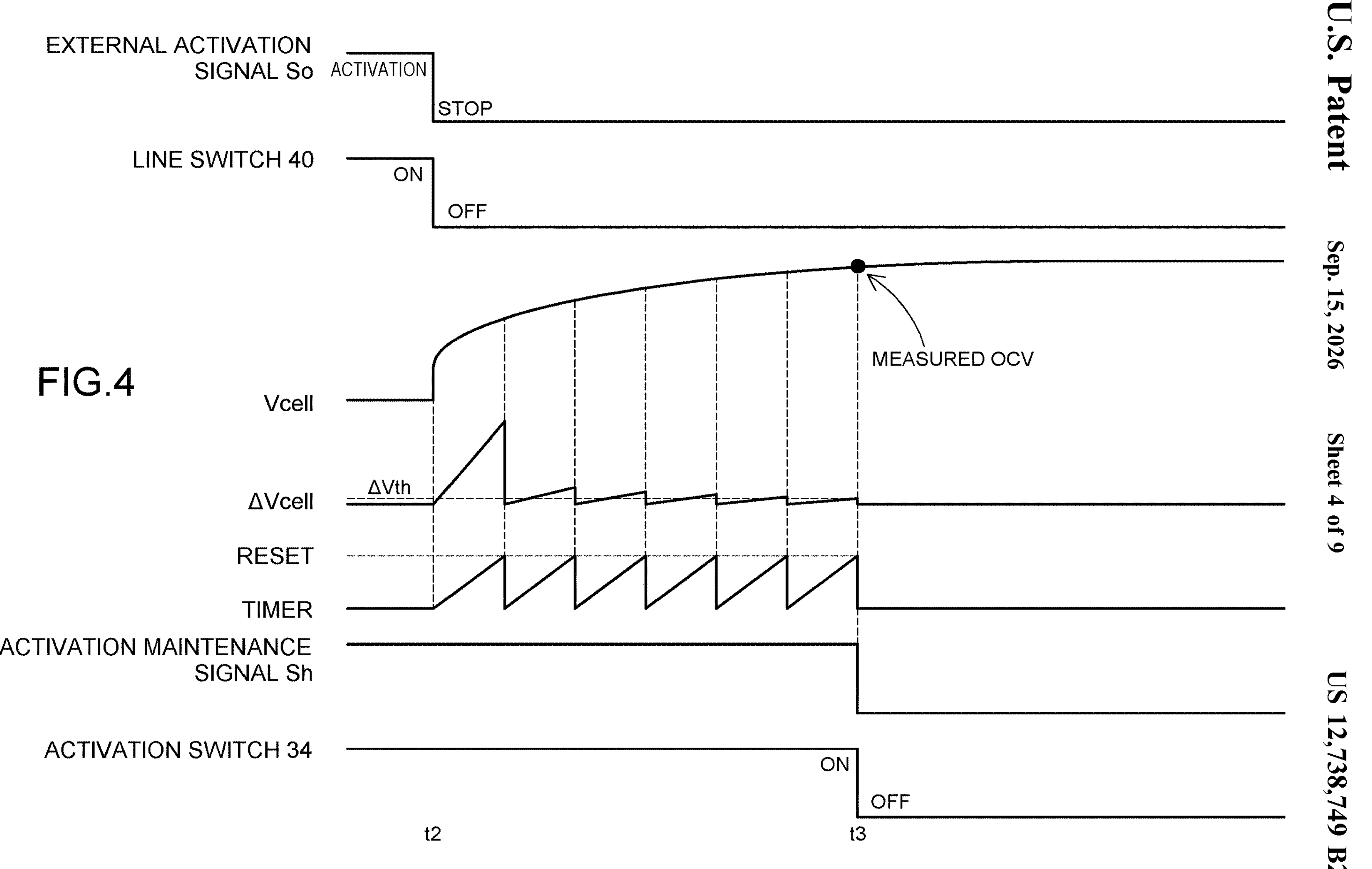

Next, the storage battery management process performed by the storage battery management device 20 in the battery device 100 of the first embodiment will be described. The storage battery management process of the first embodiment is the process of switching the connection state between the battery assembly 10 and the load/external power source by opening and closing the line switch 40 and identifying the OCV of each storage battery 12 constituting the battery assembly 10. The storage battery management process is repeatedly executed during the operation of the battery device 100. FIG. 2 is a sequence diagram illustrating a storage battery management process of the first embodiment. FIG. 3 is an explanatory view illustrating an example of a state of each signal and a state of each switch during the storage battery management process of the first embodiment. FIG. 4 is an explanatory view illustrating an example of a state of each signal, a state of each switch, and a state of the voltage Vcell of each storage battery 12 during a particular time period (period Tl in FIG. 3) during the storage battery management process of the first embodiment.

As shown in FIG. 2, the power supply activation circuit 36 (FIG. 1) monitors whether the external activation signal So input from the input terminal 37 of the power supply activation circuit 36 indicates the activation logic (S110). The external activation signal So is a signal input via the signal reception terminal 38 to switch the battery device 100 between the activation state and stop state. When the external activation signal So becomes the activation logic (S110: YES), the power supply activation circuit 36 turns on the activation switch 34 (S120) (time t1 in FIG. 3). This starts supplying power from the battery assembly 10 to the control unit 60 via the voltage conversion circuit 32. The power supply activation circuit 36 also starts output of a monitoring signal Sm, which indicates the logic state of the external activation signal So, to the control unit 60 (S120). Thereafter, the power supply activation circuit 36 monitors whether the external activation signal So has become the stop logic (S122), and when the external activation signal So becomes the stop logic (S122: YES), the logic state of the monitoring signal Sm is switched to the stop logic (S124).

When power supply to the control unit 60 is started, the control unit 60 monitors whether the logic state of the external activation signal So indicated by the monitoring signal Sm input from the power supply activation circuit 36 is the activation logic (S210). If the logic state of the external activation signal So indicated by the monitoring signal Sm is the activation logic (S210: YES), the line switch control unit 61 of the control unit 60 turns on the line switch 40 (S220) (time t1 in FIG. 3). This connects the battery assembly 10 to the load and the external power source. In addition, the activation maintenance control unit 62 of the control unit 60 starts output of an activation maintenance signal Sh to the power supply activation circuit 36 (S220). The power supply activation circuit 36 monitors whether the activation maintenance signal Sh is input from the control unit 60 (S130), and maintains the on-state of the activation switch 34 as long as the activation maintenance signal Sh is input (S130: YES). It should be noted that the power supply activation circuit 36 continues to monitor whether the external activation signal So has become the stop logic (S122) as long as the activation maintenance signal Sh is input (S130: YES).

The control unit 60 then monitors whether the logic state of the external activation signal So indicated by the monitoring signal Sm input from the power supply activation circuit 36 is the stop logic (S230). When the logic state of the external activation signal So indicated by the monitoring signal Sm becomes the stop logic (S230: YES), the line switch control unit 61 of the control unit 60 turns off the line switch 40 (S240) (time t2 in FIGS. 3 and 4). This disconnects the battery assembly 10 from the load and the external power source, and the voltage Vcell of each storage battery 12 changes to converge toward OCV.

When the line switch 40 is turned off (S240), the OCV identifying unit 63 of the control unit 60 starts the OCV identifying process for each storage battery 12, which is described below (S250). That is, as shown in FIG. 4, the OCV identifying unit 63 of the control unit 60 acquires the change amount ΔVcell of the voltage Vcell (change amount of the voltage per predetermined time) of each storage battery 12 measured by the voltmeter 22 and the monitoring unit 28 at predetermined time intervals measured by the timer unit 64. When the change amount ΔVcell of the voltage Vcell of each storage battery 12 all becomes equal to or smaller than the predetermined change amount ΔVth, the OCV identifying unit 63 records the voltage Vcell of each storage battery 12 at that time point in the recording unit 70 as the OCV. When the change amount ΔVcell of the voltage Vcell of each storage battery 12 all becomes equal to or smaller than the predetermined change amount ΔVth, the voltage Vcell of each storage battery 12 can be considered to be sufficiently converged to the OCV, such that the voltage Vcell at that time point is recorded as the OCV.

After starting the OCV identifying process (S250), the control unit 60 monitors whether the logic state of the external activation signal So indicated by the monitoring signal Sm is the stop logic (S260) and whether the OCV identifying process is completed (S270). When the logic state of the external activation signal So indicated by the monitoring signal Sm is the stop logic (S260: YES) and the OCV identifying process is completed (S270: YES), the OCV identifying unit 63 of the control unit 60 causes the activation maintenance control unit 62 to stop the output of the activation maintenance signal Sh (S280) (time t3 in FIGS. 3 and 4). When the output of the activation maintenance signal Sh is stopped, the power supply activation circuit 36 determines that the activation maintenance signal Sh is not input from the control unit 60 (S130: NO) and turns off the activation switch 34 (S140). As a result, the power supply from the battery assembly 10 to the control unit 60 via the voltage conversion circuit 32 is stopped, and the power consumption by the control unit 60 becomes zero. If the logic state of the external activation signal So indicated by the monitoring signal Sm becomes the activation logic (S260: NO) before the OCV identifying process is completed (S270: NO), the control unit 60 executes the process after S220 described above in the same manner. Thereafter, the above-mentioned process is repeatedly executed.

A-3. Effects of the First Embodiment

As explained above, the storage battery management device 20 of this embodiment is a device that manages a battery assembly 10 in which a plurality of storage batteries 12 are connected in series. The storage battery management device 20 includes the voltmeter 22 and the monitoring unit 28, the control unit 60, the voltage conversion circuit 32, the activation switch 34, and the power supply activation circuit 36. The voltmeter 22 and monitoring unit 28 measure the voltage Vcell of each of the plurality of storage batteries 12. The voltage conversion circuit 32 is provided on the path 35 that supplies power from the battery assembly 10 to the control unit 60. The activation switch 34 is connected between the voltage conversion circuit 32 and the battery assembly 10. The power supply activation circuit 36 includes an input terminal 37 to which the external activation signal So is input, turns on the activation switch 34 when the logic state of the external activation signal So becomes the activation logic, outputs a monitoring signal Sm indicating the logic state of the external activation signal So to the control unit 60, and maintains the on-state of the activation switch 34 as long as the activation maintenance signal Sh is input from the control unit 60.

The control unit 60 includes the line switch control unit 61, the activation maintenance control unit 62, and the OCV identifying unit 63. The line switch control unit 61 turns on the line switch 40 connected in series with the battery assembly 10 when the logic state of the external activation signal So indicated by the monitoring signal Sm becomes the activation logic, and turns off the line switch 40 when the logic state of the external activation signal So indicated by the monitoring signal Sm becomes the stop logic. The activation maintenance control unit 62 starts output of the activation maintenance signal Sh to the power supply activation circuit 36 when the logic state of the external activation signal So indicated by the monitoring signal Sm becomes the activation logic. The OCV identifying unit 63 acquires the change amount ΔVcell of the voltage Vcell of each of the plurality of storage batteries 12 at predetermined time intervals when the logic state of the external activation signal So indicated by the monitoring signal Sm becomes the stop logic, and when the change amount ΔVcell of the voltage Vcell of each of the plurality of storage batteries 12 all becomes equal to or smaller than the predetermined change amount ΔVth or less, records the voltage Vcell of each of the plurality of storage batteries 12 at that time point as the OCV, and causes the activation maintenance control unit 62 to stop the output of the activation maintenance signal Sh.

Thus, according to the storage battery management device 20 of this embodiment, after the logic state of the external activation signal So indicated by the monitoring signal Sm becomes the stop logic and the line switch 40 is turned off, when the change amount ΔVcell of the voltage Vcell of each storage battery 12 all becomes equal to or smaller than the predetermined change amount ΔVth, i.e. when the voltage Vcell of each storage battery 12 converges sufficiently, the voltage Vcell at that time point is recorded as the OCV, and thus the OCV of each storage battery 12 can be accurately identified. As a result, the predetermined process (e.g., estimation of SOC) using the OCV can be accurately executed. In addition, according to the storage battery management device 20 of this embodiment, the power consumption required to identify the OCV of each storage battery 12 can be reduced because the output of the activation maintenance signal Sh is stopped immediately after the OCV is recorded, the activation switch 34 is turned off, and the power supply from the battery assembly 10 to the control unit 60 is stopped.

B. Second Embodiment

Figure 5:
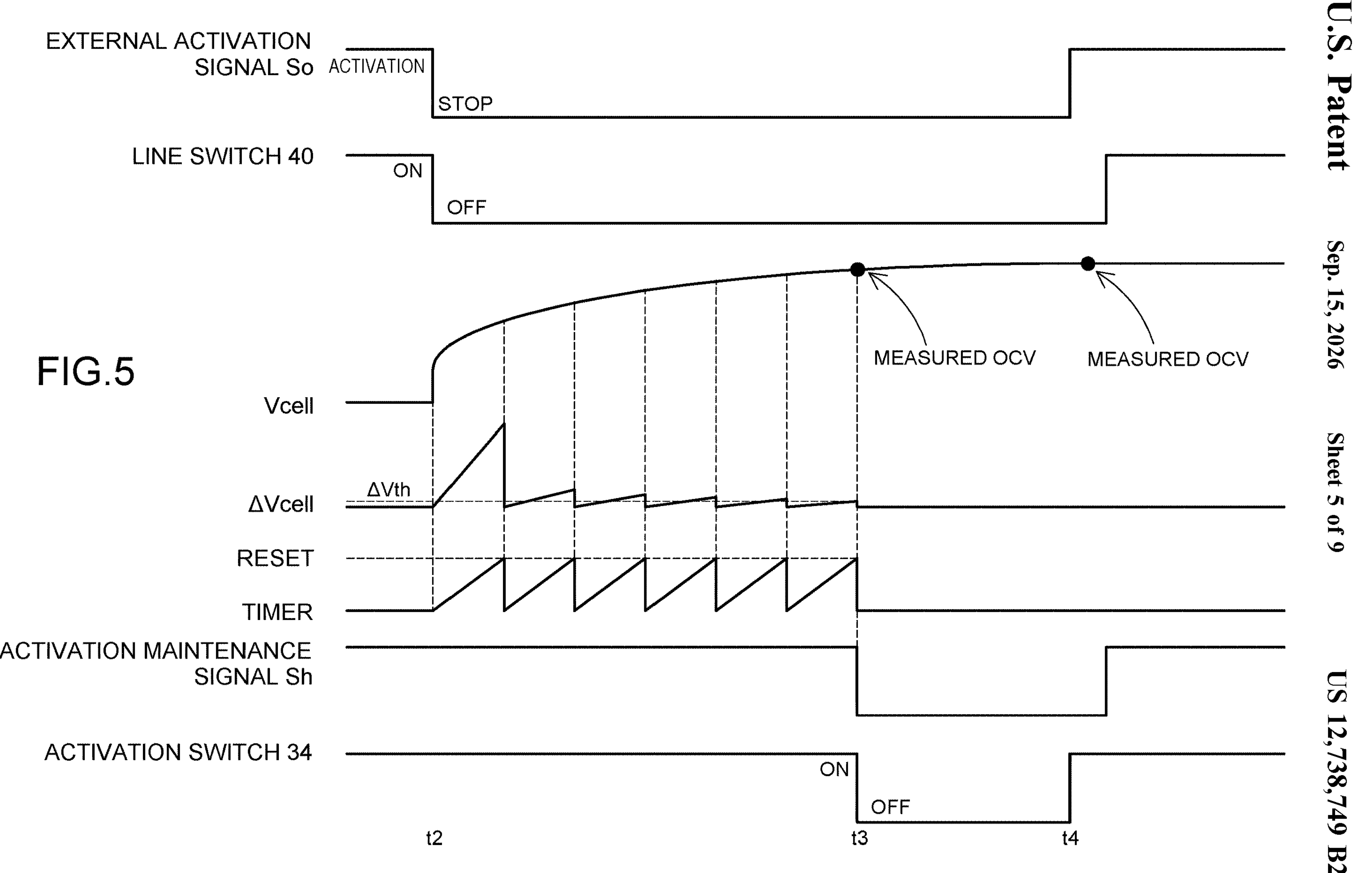

FIG. 5 is an explanatory view illustrating an example of a state of each signal, a state of each switch, and a state of the voltage Vcell of each storage battery 12 during a particular time period in the storage battery management process of a second embodiment. In the following, only the points in the battery management process of the second embodiment that differ from the battery management process of the first embodiment described above will be described, and the description of the points identical to the battery management process of the first embodiment will be omitted as appropriate.

In the storage battery management process of the second embodiment, after the OCV identifying process for each storage battery 12 is completed (S270: YES in FIG. 2), the output of the activation maintenance signal Sh is stopped (S280), and the activation switch 34 is turned off (S140) (time t3 in FIG. 5), when the logic state of the external activation signal So becomes the activation logic (time t4 in FIG. 5), the OCV identifying unit 63 of the control unit 60 records the voltage Vcell of each storage battery 12 at that time point as the OCV (i.e., updates the OCV of each storage battery 12 recorded in the recording unit 70), and then causes the line switch control unit 61 to turn on the line switch 40.

Thus, in the storage battery management process of the second embodiment, when the logic state of the external activation signal So indicated by the monitoring signal Sm becomes the stop logic, the OCV identifying unit 63 of the control unit 60 acquires the change amount ΔVcell of the voltage Vcell of each storage battery 12 measured by the voltmeter 22 and the monitoring unit 28 at predetermined time intervals, when the change amount ΔVcell of the voltage Vcell of each storage battery 12 all becomes equal to or smaller than the predetermined change amount ΔVth, causes the activation maintenance control unit 62 to stop the output of the activation maintenance signal Sh, and then when the logic state of the external activation signal So becomes the activation logic, records the voltage Vcell of each storage battery 12 at that time point as the OCV and causes and the line switch control unit 61 to turn on the line switch 40. Therefore, the storage battery management process of the second embodiment records the voltage Vcell of each storage battery 12 that has converged further enough as the OCV so that it is possible to more accurately identify the OCV of each storage battery 12. As a result, it is possible to more accurately perform predetermined processes (e.g., estimation of SOC) that use the OCV.

C. Third Embodiment

Figure 6:
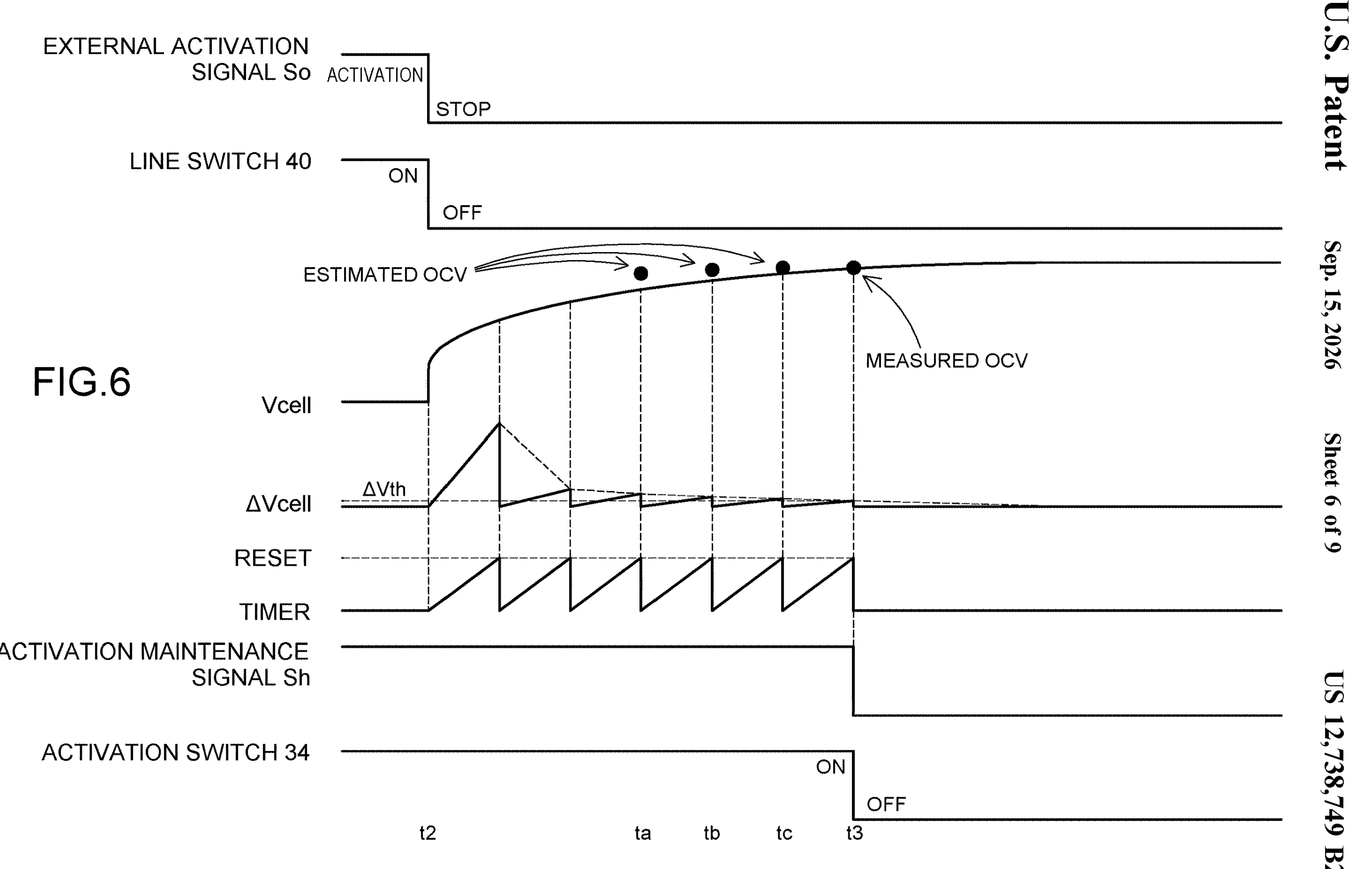

FIG. 6 is an explanatory view illustrating an example of a state of each signal, a state of each switch, and a state of the voltage Vcell of each storage battery 12 during a particular time period in the storage battery management process of a third embodiment. In the following, only the points in the battery management process of the third embodiment that differ from the battery management process of the first embodiment described above will be described, and the description of the points identical to the battery management process of the first embodiment will be omitted as appropriate.

In the storage battery management process of the third embodiment, the method of the OCV identifying process (S250 in FIG. 2) differs from the storage battery management process of the first embodiment described above. Specifically, when the OCV identifying process is started, the OCV identifying unit 63 of the control unit 60 acquires the change amount ΔVcell of the voltage Vcell of each storage battery 12 at predetermined time intervals measured by the timer unit 64, as shown in FIG. 6, and then determines whether the change amount ΔVcell of the voltage Vcell of each storage battery 12 all becomes equal to or smaller than a predetermined change amount ΔVth. In this case, every time the number of acquisitions of the change amount ΔVcell of the voltage Vcell reaches a predetermined number, the OCV identifying unit 63 estimates the OCV of each storage battery 12 based on the change amount ΔVcell of the voltage Vcell acquired until then and records the estimated OCV in the recording unit 70 before the change amount ΔVcell of the voltage Vcell of each storage battery 12 all becomes equal to or smaller than the predetermined change amount ΔVth. For example, in the example shown in FIG. 6, the OCV of each storage battery 12 is estimated and recorded every time the number of acquisitions of the change amount ΔVcell of the voltage Vcell becomes three times or more (time ta, tb, tc in FIG. 6). When the change amount ΔVcell of the voltage Vcell of each storage battery 12 all becomes equal to or smaller than the predetermined change amount ΔVth (time t3 in FIG. 6), the OCV identifying unit 63 records the voltage Vcell of each storage battery 12 at that time point in the recording unit 70 as the OCV (i.e., updates the OCV of each storage battery 12 recorded in the recording unit 70).

Although the method of estimating the OCV of each storage battery 12 by the OCV identifying unit 63 is not limited, an exemplary method may be employed which calculates an approximate curve representing the temporal transition of the voltage Vcell of each storage battery 12 based on the change amount ΔVcell of the voltage Vcell of each storage battery 12 obtained until then, and obtains the convergence value of the voltage Vcell of each storage battery 12 in the approximate curve to estimate the convergence value as the OCV.

Thus, in the storage battery management process of the third embodiment, the OCV identifying unit 63 acquires the change amount ΔVcell of the voltage Vcell of each storage battery 12 measured by the voltmeter 22 and the monitoring unit 28 at predetermined time intervals when the logic state of the external activation signal So indicated by the monitoring signal Sm becomes the stop logic, and every time the number of acquisitions of the change amount ΔVcell of the voltage Vcell reaches a predetermined number, estimates the OCV of each storage battery 12 based on the change amount ΔVcell of the voltage Vcell acquired until then and records the estimated OCV before the change amount ΔVcell of the voltage Vcell of each storage battery 12 all becomes equal to or smaller than the predetermined change amount ΔVth. Therefore, the third embodiment can identify the OCV of each storage battery 12 at a relatively early time. As a result, it is possible to perform a predetermined process (e.g., estimation of SOC) that uses the OCV at a relatively early time.

Figure 7:
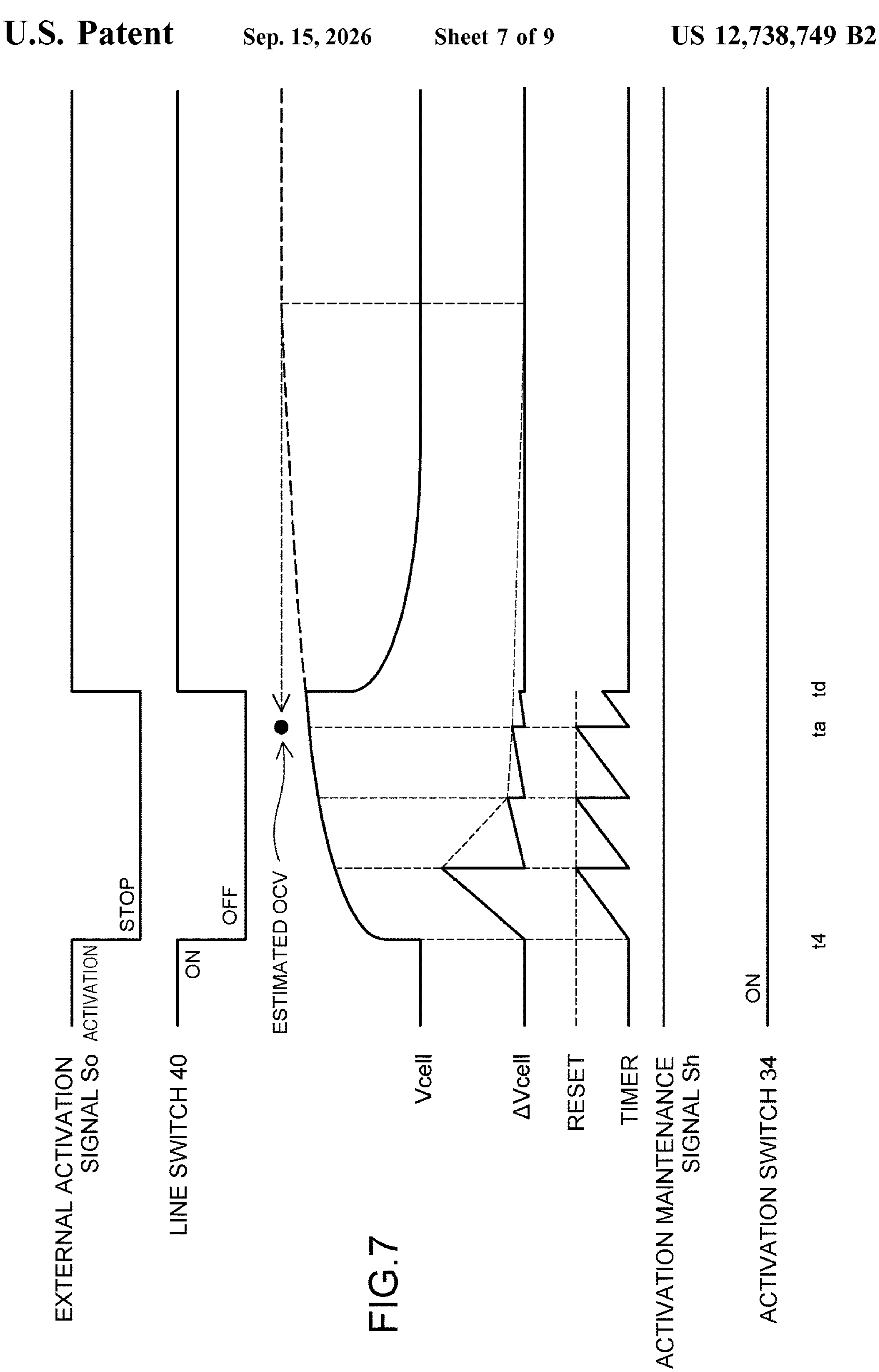

As shown in FIG. 7, if the logic state of the external activation signal So becomes the activation logic before the change amount ΔVcell of the voltage Vcell of each storage battery 12 all becomes equal to or smaller than the predetermined change amount ΔVth (time td in FIG. 7), the line switch 40 turns on and the OCV of each storage battery 12 cannot be measured. However, according to the storage battery management process of the third embodiment, even in such a case, the OCV of each storage battery 12 can be identified by using the results of the OCV estimation that was executed before that time (e.g., the estimation results at time ta in FIG. 7). As a result, it is possible to avoid that the predetermined process (e.g., estimation of SOC) that uses the OCV becomes infeasible.

D. Fourth Embodiment

Figure 8:
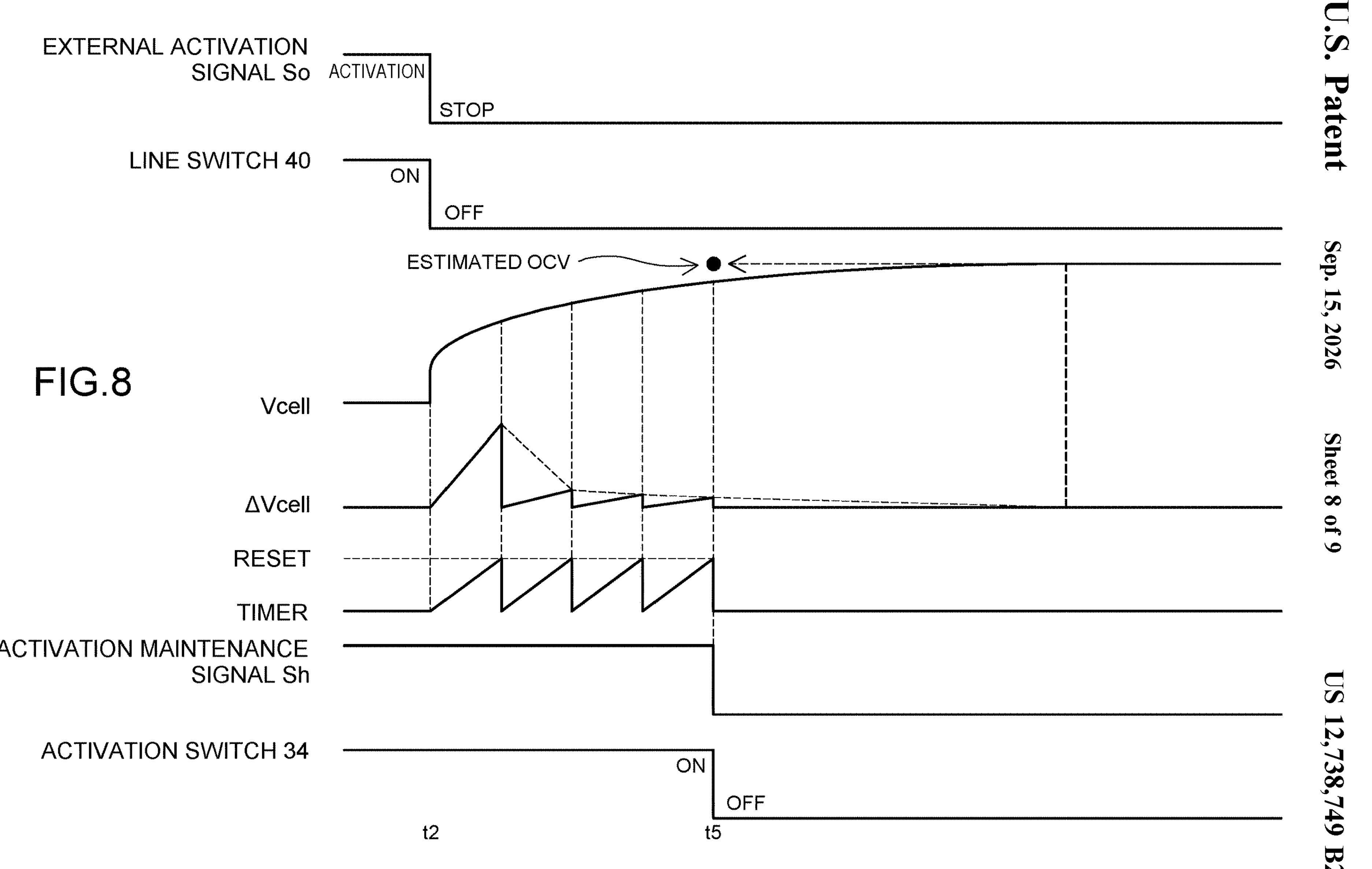

FIG. 8 is an explanatory view illustrating an example of a state of each signal, a state of each switch, and a state of the voltage Vcell of each storage battery 12 during a particular time period in the battery management process of the fourth embodiment. In the following, only the points of the battery management process of the fourth embodiment that differ from the battery management process of the first embodiment described above will be described, and the description of the points identical to the battery management process of the first embodiment will be omitted as appropriate.

In the storage battery management process of the fourth embodiment, the method of the OCV identifying process (S250 in FIG. 2) differs from the storage battery management process of the first embodiment described above. Specifically, when the OCV identifying process is started, the OCV identifying unit 63 of the control unit 60 acquires the change amount ΔVcell of the voltage Vcell of each storage battery 12 at predetermined time intervals measured by the timer unit 64, as shown in FIG. 8, and when the number of acquisitions of the change amount ΔVcell of the voltage Vcell reaches a predetermined number, the OCV identifying unit 63 estimates the OCV of each storage battery 12 based on the change amount ΔVcell of the voltage Vcell acquired until then, and records the estimated OCV in the recording unit 70. For example, in the example shown in FIG. 8, when the number of acquisitions of the change amount ΔVcell of the voltage Vcell reaches four times (time t5 in FIG. 8), the OCV of each storage battery 12 is estimated and recorded. The method of estimating the OCV of each storage battery 12 based on the change amount ΔVcell of the voltage Vcell may be the same as the estimation method in the third embodiment described above. The OCV identifying unit 63 then immediately causes the activation maintenance control unit 62 to stop the output of the activation maintenance signal Sh.

Thus, in the storage battery management process of the fourth embodiment, when the logic state of the external activation signal So indicated by the monitoring signal Sm becomes the stop logic, the OCV identifying unit 63 acquires the change amount Δ Vcell of the voltage Vcell of each storage battery 12 measured by the voltmeter 22 and the monitoring unit 28 at predetermined time intervals, and when the number acquisitions of the change amount ΔVcell of the voltage Vcell reaches a predetermined number, the OCV identifying unit 63 estimates the OCV of each storage battery 12 based on the change amount ΔVcell of the voltage Vcell acquired until then, records the estimated OCV, and causes the activation maintenance control unit 62 to stop the output of the activation maintenance signal Sh. Therefore, according to the storage battery management process of the fourth embodiment, once the OCV of each storage battery 12 is recorded, it is possible to immediately stop the output of the activation maintenance signal Sh, turn off the activation switch 34, and stop the power supply from the battery assembly 10 to the control unit 60, thereby reducing the power consumption required to identify the OCV of each storage battery 12. In particular, according to the storage battery management process of the fourth embodiment, the identification of the OCV of each storage battery 12 can be completed and the power supply from the battery assembly 10 to the control unit 60 can be stopped at a predetermined timing regardless of the degree of convergence of the voltage Vcell of each storage battery 12. Therefore, even if the convergence of the voltage Vcell of each storage battery 12 takes time, as in the case of a large current flowing through the battery assembly 10 immediately before, the identification of the OCV of each storage battery 12 can be completed and the power supply from the battery assembly 10 to the control unit 60 can be stopped before the convergence, which effectively reduce the power consumption required to identify the OCV of each storage battery 12.

E. Fifth Embodiment

Figure 9:
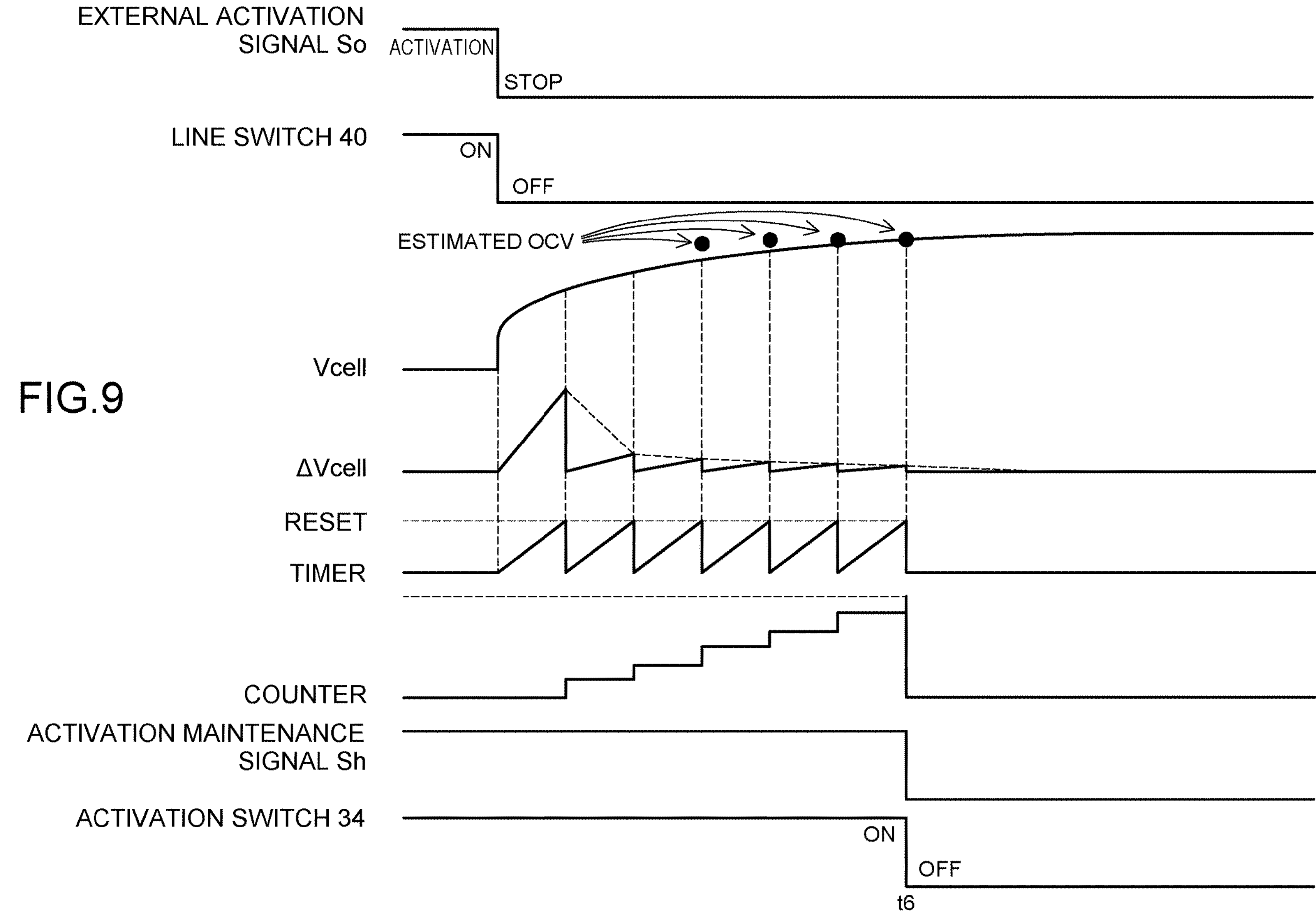

FIG. 9 is an explanatory view illustrating an example of a state of each signal, a state of each switch, and a state of the voltage Vcell of each storage battery 12 during a particular time period in the battery management process of a fifth embodiment. In the following, only the points in the battery management process of the fifth embodiment that differ from the battery management process of the first embodiment described above will be described, and the description of the points identical to the battery management process of the first embodiment will be omitted as appropriate.

In the storage battery management process of the fifth embodiment, the method of the OCV identifying process (S250 in FIG. 2) differs from the storage battery management process of the first embodiment described above. Specifically, when the OCV identifying process is started, the OCV identifying unit 63 of the control unit 60 acquires the change amount ΔVcell of the voltage Vcell of each storage battery 12 at predetermined time intervals measured by the timer unit 64, as shown in FIG. 9, and every time the number of acquisitions of the change amount ΔVcell of the voltage Vcell reaches a predetermined number, the OCV identifying unit 63 estimates the OCV of each storage battery 12 based on the change amount ΔVcell of the voltage Vcell acquired until then and record the estimated OCV in the recording unit 70. The method of estimating the OCV of each storage battery 12 based on the change amount ΔVcell of the voltage Vcell may be the same as the estimation method in the third embodiment described above. The OCV identifying unit 63 causes the activation maintenance control unit 62 to stop the output of the activation maintenance signal Sh after a predetermined time has elapsed since the line switch 40 was turned off (i.e., since the OCV identifying process started). For example, in the example shown in FIG. 9, the estimation and recording of the OCV of each storage battery 12 is performed every time the change amount ΔVcell of the voltage Vcell is acquired three times or more, and the output of the activation maintenance signal Sh is stopped at time t6, when the predetermined time has elapsed after the line switch 40 was turned off.

Thus, in the storage battery management process of the fifth embodiment, when the logic state of the external activation signal So indicated by the monitoring signal Sm becomes the stop logic, the OCV identifying unit 63 acquires the change amount ΔVcell of the voltage Vcell of each storage battery 12 measured by the voltmeter 22 and the monitoring unit 28 at predetermined time intervals, and every time the number of acquisitions of the change amount ΔVcell of the voltage Vcell reaches a predetermined number, the OCV identifying unit 63 estimates the voltage Vcell OCV of each storage battery 12 based on the change amount ΔVcell of the voltage Vcell acquired until then and records the estimated OCV, and causes the activation maintenance control unit 62 to stop the output of the activation maintenance signal Sh when a predetermined time has elapsed since the line switch 40 was turned off. Therefore, according to the storage battery management process of the fifth embodiment, the power consumption required to identify the OCV of each storage battery 12 can be reduced because the output of the activation maintenance signal Sh is stopped immediately after the OCV is recorded, the activation switch 34 is turned off, and the power supply from the battery assembly 10 to the control unit 60 is stopped. In particular, according to the fifth embodiment, the identification of the OCV of each storage battery 12 can be completed and the power supply from the battery assembly 10 to the control unit 60 can be stopped at a predetermined timing regardless of the degree of convergence of the voltage Vcell of each storage battery 12. For example, even if the convergence of the voltage Vcell of each storage battery 12 takes time, as in the case of a large current flowing through the battery assembly 10 immediately before, the identification of the OCV of each storage battery 12 can be completed and the power supply from the battery assembly 10 to the control unit 60 can be stopped before the convergence, which effectively reduce the power consumption required to identify the OCV of each storage battery 12.

F. Modification

The technology disclosed herein is not limited to the embodiments described above, but can be modified into various forms without departing from the spirit of the present invention, for example, the following modifications are possible.

The configuration of the battery device 100 in the above embodiments is only an example and may be modified in various ways. For example, in each of the above embodiments, the number of storage batteries 12 constituting the battery assembly 10 may be modified as desired. In each of the above embodiments, the power supply activation circuit 36 and the control unit 60 may be configured as an integral component.

The contents of the storage battery management process in each of the above embodiments are only examples and can be modified in various ways. For example, for the OCV identifying process for each storage battery 12 in the storage battery management process, the method of the OCV identifying process may be changed according to the current that was flowing through the battery assembly 10 immediately before the process (immediately before the line switch 40 was turned off). Specifically, if the current that was flowing through the battery assembly 10 immediately before is relatively small, the time required for the convergence of the voltage Vcell of each storage battery 12 is considered to be relatively short, and therefore, a method may be employed which prioritizes the improvement of the accuracy of OCV identification by maintaining the activation switch 34 in the ON state until the change amount ΔVcell of the voltage Vcell of each storage battery 12 all becomes equal to or smaller than the predetermined change amount ΔVth as in the first embodiment above, on the other hand, if the current flowing through the battery assembly 10 immediately before is relatively large, the time required for the convergence of the voltage Vcell of each storage battery 12 is considered to be relatively long, and therefore, a method may be employed which prioritizes the reduction of power consumption by turning off the activation switch 34 before the change amount ΔVcell of the voltage Vcell of each storage battery 12 all becomes equal to or smaller than the predetermined change amount ΔVth as in the third and fourth embodiments above.

Furthermore, in the above third to fifth embodiments, as in the second embodiment, after the OCV identifying process for each storage battery 12 is completed, the output of the activation maintenance signal Sh is stopped, and the activation switch 34 is turned off, when the logic state of the external activation signal So becomes the activation logic, the voltage Vcell of each storage battery 12 at that time point may be recorded as the OCV, and then the line switch 40 may be turned on.

REFERENCE SIGNS LIST

10: battery assembly, 12: storage battery, 20: storage battery management device, 22: voltmeter, 24: ammeter, 28: monitoring unit, 32: voltage conversion circuit, 34: activation switch, 35: path, 36: power supply activation circuit, 37: input terminal, 38: signal reception terminal, 40: line switch, 42: positive terminal, 44: negative terminal, 60: control unit, 61: line switch control unit, 62: activation maintenance control unit, 63: OCV identifying unit, 64: timer unit, 70: recording unit, 100: battery device, Sh: activation maintenance signal Sm: monitoring signal, So: external activation signal

The invention claimed is:

1. A storage battery management device that manages a battery assembly in which a plurality of storage batteries are connected in series, the storage battery management device comprising:

a voltage measuring unit that measures the voltage of each of the plurality of storage batteries;

a control unit;

a voltage conversion circuit provided on a path that supplies electric power from the battery assembly to the control unit;

an activation switch connected between the voltage conversion circuit and the battery assembly; and a power supply activation circuit that includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit, wherein the control unit comprises:

a line switch control unit that turns on a line switch connected in series with the battery assembly when the logic state of the external activation signal becomes an activation logic, and turns off the line switch when the logic state of the external activation signal becomes a stop logic;

an activation maintenance control unit that starts the output of the activation maintenance signal to the power supply activation circuit when the logic state of the external activation signal becomes the activation logic; and an OCV identifying unit that acquires the change amount of the voltage of each of the plurality of storage batteries measured by the voltage measuring unit at predetermined time intervals when the logic state of the external activation signal becomes the stop logic, and when the change amount of the voltage of each of the plurality of storage batteries all becomes equal to or smaller than a predetermined change amount, records the voltage of each of the plurality of storage batteries at that time point as the OCV and causes the activation maintenance control unit to stop the output of the activation maintenance signal.

2. The storage battery management device according to claim 1, wherein the OCV identifying unit acquires the change amount of the voltage of each of the plurality of storage batteries measured by the voltage measuring unit at predetermined time intervals when the logic state of the external activation signal becomes the stop logic, and every time the number of acquisitions of the change amount of the voltage reaches a predetermined number, estimates the OCV of each of the plurality of storage batteries based on the change amount of the voltage acquired until then and records the estimated OCV before the change amounts of the voltage of each of the plurality of storage batteries all becomes equal to or smaller than a predetermined change amount.

3. A storage battery management device that manages a battery assembly in which a plurality of storage batteries are connected in series, the storage battery management device comprising:

a voltage measuring unit that measures the voltage of each of the plurality of storage batteries;

a control unit;

a voltage conversion circuit provided on a path that supplies electric power from the battery assembly to the control unit;

an activation switch connected between the voltage conversion circuit and the battery assembly; and a power supply activation circuit that includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit, the control unit comprising:

a line switch control unit that turns on a line switch connected in series with the battery assembly when the logic state of the external activation signal becomes an activation logic, and turns off the line switch when the logic state of the external activation signal becomes a stop logic;

an activation maintenance control unit that starts the output of the activation maintenance signal to the power supply activation circuit when the logic state of the external activation signal becomes the activation logic; and an OCV identifying unit that acquires the change amount of the voltage of each of the plurality of storage batteries measured by the voltage measuring unit at predetermined time intervals when the logic state of the external activation signal becomes the stop logic, and when the number of acquisitions of the change amount reaches a predetermined number, estimates the OCV of each of the plurality of storage batteries based on the change amount of the voltage acquired until then, records the estimated OCV, and causes the activation maintenance control unit to stop the output of the activation maintenance signal.

4. A storage battery management device that manages a battery assembly in which a plurality of storage batteries are connected in series, the storage battery management device comprising:

a voltage measuring unit that measures the voltage of each of the plurality of storage batteries;

a control unit;

a voltage conversion circuit provided on a path that supplies electric power from the battery assembly to the control unit;

an activation switch connected between the voltage conversion circuit and the battery assembly; and a power supply activation circuit that includes an input terminal to which an external activation signal is input, turns on the activation switch when a logic state of the external activation signal becomes an activation logic, outputs a monitoring signal indicating the logic state of the external activation signal to the control unit, and maintains the on-state of the activation switch as long as an activation maintenance signal is input from the control unit, the control unit comprising:

a line switch control unit that turns on a line switch connected in series with the battery assembly when the logic state of the external activation signal becomes an activation logic, and turns off the line switch when the logic state of the external activation signal becomes a stop logic;

an activation maintenance control unit that starts the output of the activation maintenance signal to the power supply activation circuit when the logic state of the external activation signal becomes the activation logic; and an OCV identifying unit that acquires the change amount of the voltage of each of the plurality of storage batteries measured by the voltage measuring unit at predetermined time intervals when the logic state of the external activation signal becomes the stop logic, and every time the number of acquisitions of the change amount of the voltage reaches a predetermined number, estimates the OCV of each of the plurality of storage batteries based on the change amount of the voltage acquired until then, records the estimated OCV, and causes the activation maintenance control unit to stop the output of the activation maintenance signal when a predetermined time has elapsed since the line switch was turned off.

5. The storage battery management device according to claim 1, wherein the OCV identifying unit acquires the change amount of the voltage of each of the plurality of storage batteries measured by the voltage measuring unit at predetermined time intervals when the logic state of the external activation signal becomes the stop logic, causes the activation maintenance control unit to stop the output of the activation maintenance signal when the change amount of the voltage of each of the plurality of storage batteries all becomes equal to or smaller than a predetermined change amount, and then when the logic state of the external activation signal becomes an activation logic, records the voltage of each of the plurality of storage batteries at that time point as the OCV and causes the line switch control unit to turn on the line switch.

6. The storage battery management device according to claim 3, wherein the OCV identifying unit acquires the change amount of the voltage of each of the plurality of storage batteries measured by the voltage measuring unit at predetermined time intervals when the logic state of the external activation signal becomes the stop logic, causes the activation maintenance control unit to stop the output of the activation maintenance signal when the change amount of the voltage of each of the plurality of storage batteries all becomes equal to or smaller than a predetermined change amount, and then when the logic state of the external activation signal becomes an activation logic, records the voltage of each of the plurality of storage batteries at that time point as the OCV and causes the line switch control unit to turn on the line switch.

7. The storage battery management device according to claim 4, wherein the OCV identifying unit acquires the change amount of the voltage of each of the plurality of storage batteries measured by the voltage measuring unit at predetermined time intervals when the logic state of the external activation signal becomes the stop logic, causes the activation maintenance control unit to stop the output of the activation maintenance signal when the change amount of the voltage of each of the plurality of storage batteries all becomes equal to or smaller than a predetermined change amount, and then when the logic state of the external activation signal becomes an activation logic, records the voltage of each of the plurality of storage batteries at that time point as the OCV and causes the line switch control unit to turn on the line switch.

* * * * *